United States Patent
Dening et al.

(10) Patent No.: US 6,819,941 B2
(45) Date of Patent: Nov. 16, 2004

(54) SINGLE OUTPUT STAGE POWER AMPLIFICATION FOR MULTIMODE APPLICATIONS

(75) Inventors: David Dening, Stokesdale, NC (US); Victor E. Steel, Oak Ridge, NC (US); Jon D. Jorgenson, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 433 days.

(21) Appl. No.: 09/975,659

(22) Filed: Oct. 11, 2001

(65) Prior Publication Data

US 2003/0073418 A1 Apr. 17, 2003

(51) Int. Cl.[7] .................................................. H04M 1/00
(52) U.S. Cl. .............................. 455/552.1; 455/550.1; 455/127.1
(58) Field of Search ........................ 455/552.1, 550.1, 455/127.1, 125, 115.1, 114.2, 91, 572, 432.2, 435.2; 330/133, 134, 132

(56) References Cited

U.S. PATENT DOCUMENTS

| | | | |
|---|---|---|---|
| 5,060,294 A | * 10/1991 | Schwent et al. ............... 455/93 |
| 5,276,912 A | 1/1994 | Siwiak et al. .................. 455/73 |
| 5,423,078 A | * 6/1995 | Epperson et al. ........ 455/553.1 |
| 5,432,473 A | * 7/1995 | Mattila et al. ............... 330/133 |
| 5,438,684 A | 8/1995 | Schwent et al. ............... 455/89 |
| 5,455,968 A | 10/1995 | Pham ......................... 455/127 |
| 5,532,646 A | 7/1996 | Aihara ........................ 330/279 |
| 5,540,246 A | 7/1996 | Minkin et al. ............ 134/104.1 |
| 5,546,051 A | 8/1996 | Koizumi et al. ............. 330/297 |
| 5,548,246 A | 8/1996 | Yamamoto et al. ........... 330/51 |
| 5,673,287 A | * 9/1997 | Colvis et al. ................ 375/216 |
| 5,771,470 A | 6/1998 | Nimmo et al. ............... 455/572 |
| 5,903,854 A | 5/1999 | Abe et al. .................... 455/575 |
| 5,955,926 A | 9/1999 | Uda et al. .................... 330/295 |
| 5,960,334 A | 9/1999 | Nakano .................... 455/180.1 |
| 5,969,582 A | * 10/1999 | Boesch et al. ............... 333/129 |
| 5,995,814 A | 11/1999 | Yeh .......................... 455/180.1 |
| 5,999,057 A | 12/1999 | Carlsson et al. ............. 330/279 |
| 6,043,721 A | 3/2000 | Nagode et al. .............. 332/117 |
| 6,078,794 A | 6/2000 | Peckham et al. ............ 455/127 |
| 6,091,966 A | 7/2000 | Meadows ..................... 455/553 |
| 6,104,247 A | 8/2000 | Ha .............................. 330/295 |
| 6,114,911 A | 9/2000 | Iwai et al. .................... 330/295 |
| 6,118,989 A | 9/2000 | Abe et al. ..................... 455/127 |
| 6,122,492 A | 9/2000 | Sears .......................... 455/127 |
| 6,122,532 A | 9/2000 | Taylor ......................... 455/574 |
| 6,133,793 A | 10/2000 | Lau et al. .................... 330/302 |
| 6,140,892 A | 10/2000 | Uda et al. .................... 333/204 |

FOREIGN PATENT DOCUMENTS

| | | | |
|---|---|---|---|
| EP | 0 837 559 A1 | 4/1998 | ............. H03F/3/72 |
| EP | 0 883 250 A2 | 12/1998 | ............. H04B/1/04 |
| WO | WO 01/10013 A1 | 2/2001 | ............. H03F/1/02 |

OTHER PUBLICATIONS

International Search Report for counterpart foreign application PCT/US02/31457, mailed on Dec. 4, 2003.

* cited by examiner

Primary Examiner—Sonny Trinh
(74) Attorney, Agent, or Firm—Withrow & Terranova, PLLC

(57) ABSTRACT

The present invention eliminates the need for complex impedance networks or parallel amplification stages for multi-mode mobile terminals. A wideband power amplifier is configured to amplify signals in different frequency bands corresponding to different operating modes. The supply voltage of the wideband power amplifier is adjusted in light of the load impedance of radiating circuitry to achieve a desired output power for the respective operating modes.

30 Claims, 3 Drawing Sheets

SINGLE OUTPUT STAGE POWER AMPLIFICATION FOR MULTIMODE APPLICATIONS

FIELD OF THE INVENTION

The present invention relates to wireless communications, and in particular, to a unique technique for controlling amplifier performance in multiple communication modes by varying a supply voltage for the amplifier.

BACKGROUND OF THE INVENTION

The present invention is particularly useful in mobile terminals, such as personal communication assistants, pagers, headsets, wireless modems, analog and digital cellular telephones, and the like. Since many of these devices are battery-powered, amplifier efficiency is preferably maximized to extend battery life. When amplifiers are designed for their highest efficiency in converting DC energy into RF energy, parasitic losses are minimized, bandwidths are reduced to a bare minimum, harmonics are terminated, and high-Q matching networks are employed. Unfortunately, these design goals are counter to current approaches used to implement multi-mode amplifiers capable of operating at multiple frequencies.

Most RF power amplifiers are designed to operate over a single band of frequencies. If coverage is desired for one or more additional frequency bands, a multi-band amplifier is typically created. For a dual-mode application, the most straightforward approach is to simply use two amplifiers and switch between them to select a desired band for transmission. If a single amplifier configuration is desired, then matching networks that provide the proper impedance transformation for both frequency bands are required. These matching networks are implemented in a number of ways. The use of series and parallel resonant elements, typically inductors and capacitors, in the matching networks are selected such that at one frequency band, the combination appears inductive and at the other band, it appears capacitive. Clever combinations of series and shunt element pairs may allow a creation of networks that deliver the desired properties over multiple frequency bands. These approaches typically result in limited bandwidth for each band and difficulty in tuning and maintaining performance over each of the bands.

If the amplifier is designed to operate in one band at a time, one or more switches are typically used to add elements to or remove elements from the matching networks for the appropriate band. This works well and has been employed in many applications. The drawbacks are the additional energy needed to operate the switches and the losses the switches add to the networks. If a change in the amplifier mode is desired, such as changing linearity, efficiency, or power, then the load of the amplifier may be switched by adding or removing elements from the matching network. Examples of these techniques are disclosed in U.S. Pat. Nos. 5,438,684 and 5,673,287, which are assigned to Motorola, Inc. Again, the switching techniques reduce system efficiency, which results in decreased battery life. As such, there is a need for an improved and efficient multi-mode amplification technique that does not require inefficient and complicated matching networks and amplifier designs.

SUMMARY OF THE INVENTION

The present invention eliminates the need for complex impedance networks or parallel amplification stages for multi-mode mobile terminals. A wideband power amplifier is configured to amplify signals in different frequency bands corresponding to different operating modes. The supply voltage of the wideband power amplifier is adjusted in light of the load impedance of radiating circuitry to achieve a desired output power for the respective operating modes.

Accordingly, the present invention relates to a radio frequency communication system including radiating circuitry, a wideband power amplifier output stage, a variable power supply, and a control system. The radiating circuitry, which includes an antenna, has a load impedance. The wideband power amplifier output stage is coupled to the radiating circuitry and is adapted to amplify a radio frequency signal in each of a plurality of frequency bands corresponding to a plurality of operating modes. The variable power supply is adapted to provide a selected supply voltage for supplying power to the wideband power amplifier output stage in response to a power control signal. The control system is adapted to generate the power control signal based on a selected one of the plurality of operating modes. The selected supply voltage and the load impedance for the frequency band of the selected operating mode determine the power delivered to the radiating circuitry from the wideband power amplifier output stage for each of the plurality of operating modes.

The power level for any given operating mode may be further controlled by controlling a signal level for the radio frequency signals to be amplified by the wideband power amplifier. Alternatively, controlling the selected supply voltage may control the power level.

The wideband power amplifier output stage is preferably made of transistors configured to operate in a saturation region when in one of the selected operating modes and in a linear region when in another of the selected operating modes. Preferably, one or more wideband intermediate amplifier stages are coupled in series to the wideband power amplifier output stage. The intermediate amplifier states are fed by combining circuitry for passing signals within the frequency band of the selected operating mode.

Bias circuitry is used to provide bias to the wideband power amplifier output stage. The bias is configured to optimize efficiency of the wideband power amplifier output stage at different supply voltages for each of the operating modes. Further, the radiating circuitry may include a selectable impedance component to adjust the reactance of the load impedance for at least one of the operation modes to optimize signal transmission. The radiating circuitry may be configured to provide a load impedance having a first impedance for a first frequency band and a second impedance for a second frequency band. The first and second impedances may be substantially the same or may vary based on design considerations. In operation, the supply voltages for the wideband power amplifier output stage will set the output power levels.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
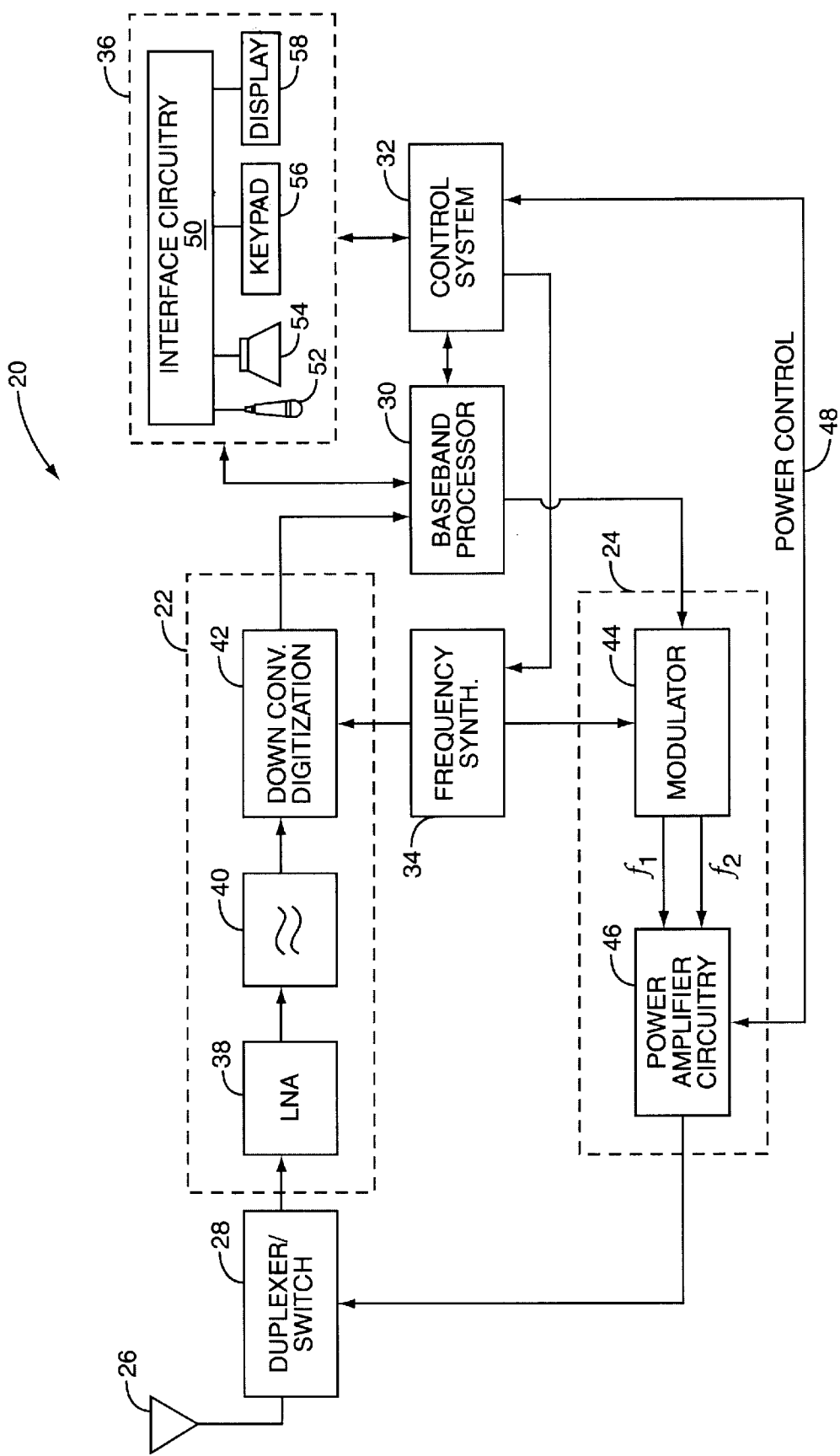
FIG. 1 is a schematic representation of a mobile terminal configured according to one embodiment of the present invention.

The present invention may be incorporated in a mobile terminal 20, such as a mobile telephone, wireless personal digital assistant, or like communication device. The basic architecture of a mobile terminal 20 is represented in FIG. 1 and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station. A low noise amplifier 38 amplifies the signal. A filter circuit 40 minimizes broadband interference in the received signal, while downconversion and digitization circuitry 42 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data, which may represent voice, data, or control information, from the control system 32, which it encodes for transmission. The encoded data is output to the transmitter 24, where it is used by a modulator 44 to modulate a carrier signal that is at a desired transmit frequency. Power amplifier circuitry 46 amplifies the modulated carrier signal to a level appropriate for transmission according to a power control signal 48, and delivers the amplified and modulated carrier signal to antenna 26 through the duplexer or switch 28. Notably, a traditional impedance transformation network is not necessary with the present invention.

The modulator 44 and power amplifier circuitry 46 are configured to operate in multiple modes, which requires transmission of modulated carrier signals at different frequencies depending on the desired mode. Within any given mode, power levels are typically dictated by a servicing base station. Further, the power amplifier circuitry 46 may be biased for saturated operation for one mode and linear operation in another. Further details are provided below.

A user may interact with the mobile terminal 20 via the interface 36, which may include interface circuitry 50 associated with a microphone 52, a speaker 54, a keypad 56, and a display 58. The interface circuitry 50 typically includes analog-to-digital converters, digital-to-analog converters, amplifiers, and the like. Additionally, it may include a voice encoder/decoder, in which case it may communicate directly with the baseband processor 30.

The microphone 52 will typically convert audio input, such as the user's voice, into an electrical signal, which is then digitized and passed directly or indirectly to the baseband processor 30. Audio information encoded in the received signal is recovered by the baseband processor 30, and converted by the interface circuitry 50 into an analog signal suitable for driving speaker 54. The keypad 56 and display 58 enable the user to interact with the mobile terminal 20, input numbers to be dialed, address book information, or the like, as well as monitor call progress information.

Figure 2:
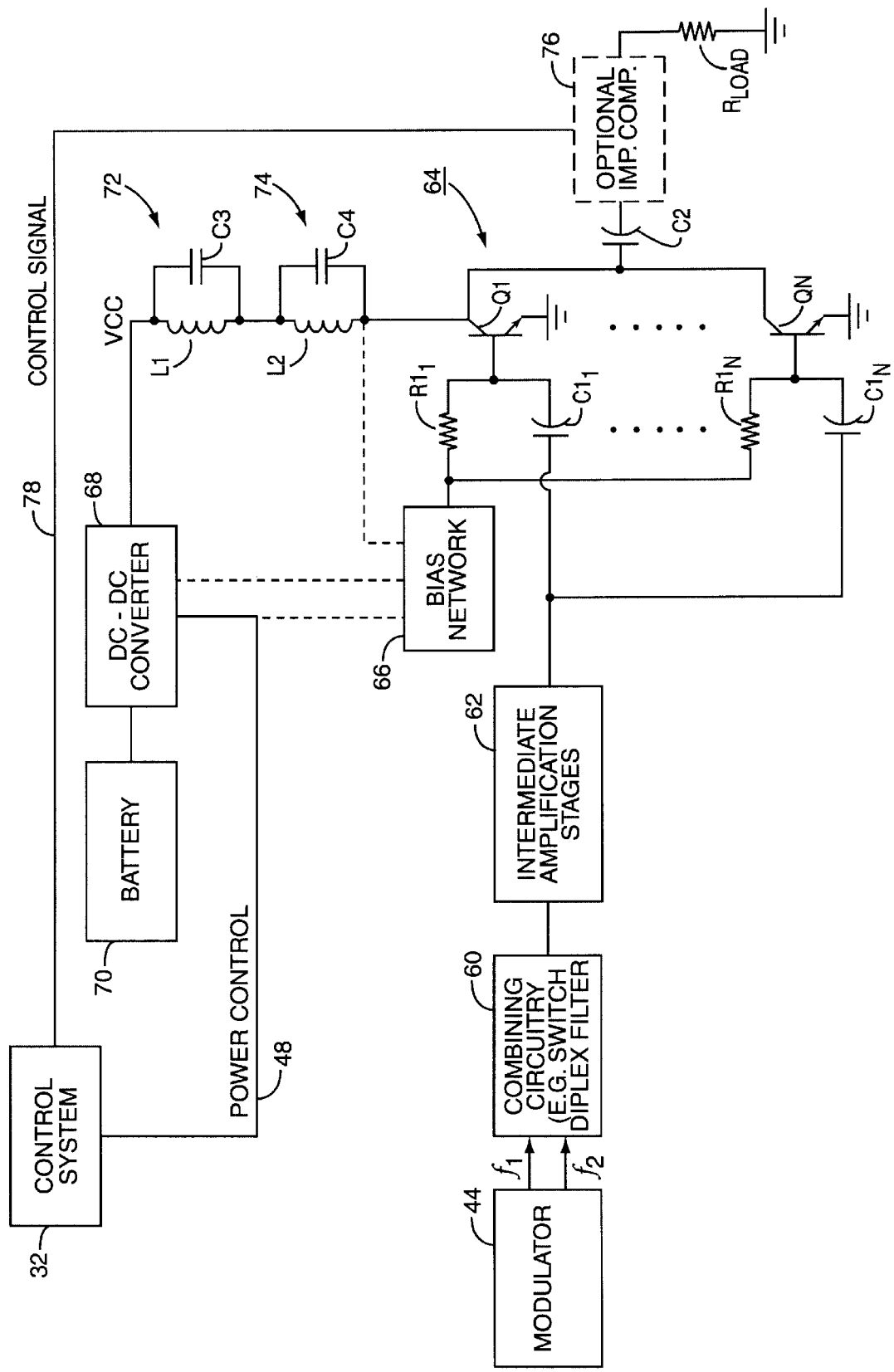
FIG. 2 is a schematic representation of power amplifier circuitry configured according to one embodiment of the present invention.

With reference to FIG. 2, an amplifier and control configuration of a preferred embodiment of the present invention is described in detail. As noted, the modulator 44 is capable of modulating data using any number of modulation techniques for two or more frequency bands, $f_1$ and $f_2$, corresponding to the different modes of operation. Combining circuitry 60 is configured to pass one of the frequency bands, $f_1$ and $f_2$, depending on the selected mode of operation to intermediate amplification stages 62. The combining circuitry may be a switch or a diplex filter capable of passing frequencies in any of the possible frequency bands, $f_1$ and $f_2$. Those skilled in the art will recognize acceptable alternatives for these combining circuitry configurations.

The intermediate amplification stages 62, which may include one or more stages, will amplify the signals passed on by the combining circuitry 60 to a level required by the output amplification stage 64. Preferably, the intermediate amplification stages 62 and the output amplification stage 64 incorporate a single amplification channel providing wideband amplification for all frequency bands, $f_1$ and $f_2$. Thus, separate amplification channels configured for the respective frequency bands, $f_1$ and $f_2$, are not required.

A bias network 66 is provided for controlling bias provided to the output amplification stage 64, and if desired, to the intermediate amplification stages 62. The bias network 66 is configured to provide bias sufficient to support the type of amplifier operation, either linear or saturation, and amount of amplification desired to provide appropriate output power levels. The output amplification stage 64 may be provided by an array of identical transistors Q1 through QN. In this configuration, each transistor Q1 through QN receives identical bias from the bias network 66 through resistors $R1_1$ through $R1_N$ and the modulated signal from the intermediate amplification stages 62 through capacitors $C1_1$ through $C1_N$. Notably, the collectors of transistors Q1 through QN are coupled together to provide a common output signal to a load $R_{LOAD}$, which represents the load of antenna 26. The collectors of the transistors Q1 through QN may be coupled to the load $R_{LOAD}$ via a capacitor C2 or an optional impedance component 76, which will be discussed in detail below.

The transistors Q1 through QN are preferably heterojunction bipolar transistors (HBTs) formed on a single semiconductor and equally sized to form a transistor array. However, the inventive concepts defined herein are independent of technology (Si, GaAs, SiGe, etc.) as well as device type (BJT, FET, MESFET, HBT, etc.). Further information pertaining to the transistor array illustrated in FIG. 2 may be found in U.S. Pat. No. 5,608,353, HBT POWER AMPLIFIER, issued Mar. 4, 1997; and U.S. Pat. No. 5,629,648, HBT POWER AMPLIFIER, issued May 13, 1997, which are assigned to RF Micro Devices, Inc. of 7628 Thorndike Road, Greensboro, N.C. 27409, and wherein the disclosures are incorporated herein by reference in their entirety. Exemplary bias networks 66 capable of being used in association with the present invention are described in further detail in U.S. patent application Ser. No. 09/467,415, entitled BIAS NETWORK FOR HIGH EFFICIENCY RF LINEAR POWER AMPLIFIER, filed Dec. 20, 1999, currently pending, the disclosure of which is incorporated herein by reference in its entirety. Upon understanding the present invention, those skilled in the art will be able to construct any number of bias networks that are compatible with the present invention.

Although nominal loads $R_{LOAD}$ have traditionally been approximately 50 ohms in wireless applications, the present invention is capable of driving lower impedance loads without requiring an impedance transformation network. Normally, an impedance transformation from the output impedance of the output amplification stage 64 to the load $R_{LOAD}$ is required. In contrast, the present invention is capable of directly driving the load $R_{LOAD}$ without impedance transformation by varying the supply voltage (VCC) for at least the output amplification stage 64. Preferably, VCC is varied in a manner calculated to provide amplification to achieve a desired output power based on the load $R_{LOAD}$. Preferably, throughout the range of VCC, the bias network 66 is configured to ensure that the output amplification stage 64 is biased for optimum efficiency at any given output power in any mode of operation.

VCC is varied according to the power control signal 48, which preferably controls the output of a variable voltage supply, such as a DC-DC converter 68, capable of setting VCC based on the power control signal 48. The DC-DC converter 68 may receive a regulated battery voltage, such as 3.5 volts, from a battery 70 and provide the requisite output for VCC, which may range from 3.5 to 18 or more volts. In one embodiment, blocking filters 72 and 74 corresponding to each of the frequency bands $f_1$ and $f_2$ are placed between the DC-DC converter 68 and the collectors of transistors Q1 through QN of the output amplification stage 64. These blocking filters 72 and 74 are provided to remove any effects on the power supply by the respective operating frequencies of the frequency bands $f_1$ and $f_2$. As illustrated, the blocking filters 72 and 74 may be placed in series, and each includes an inductor L1 or L2 and capacitor C3 or C4, respectively, in parallel with one another.

As noted, the bias network 66 will provide sufficient bias to ensure efficient operation for the given mode. If the desired mode requires the transistors Q1 through QN to operate in a linear fashion, the bias is adjusted to provide efficient linear operation. If the desired mode requires transistors Q1 through QN to operate in saturation, the bias is adjusted to provide efficient saturation operation. Notably, the intermediate amplification stages 62 and output amplification stage 64 are preferably configured to have an operating bandwidth encompassing both frequency bands $f_1$ and $f_2$. Further, the intermediate amplification stages 62 and output amplification stage 64 can be configured to operate in saturation mode for one frequency band and in linear mode for another frequency band, if so desired. As illustrated, the bias network 66 may receive any one or a combination of the power control signal 48, a control signal or VCC from the DC-DC converter 68, and a feedback signal from the output of the output amplification stage 64. The bias network 66 may be self-biasing or may be configured to respond to one or more of the cited signals to affect gain, efficiency, or mode of operation.

In operation, the control system 32 will select an output power level for the desired operating mode corresponding to one of the frequency bands $f_1$ or $f_2$ and provide an appropriate power control signal 48 to the DC-DC converter 68 to set VCC at a level determined to provide the selected output power level given the load $R_{LOAD}$. Notably, the impedance of $R_{LOAD}$ may differ or be substantially the same for the respective frequency bands $f_1$ and $f_2$. Any differences in the impedance for $R_{LOAD}$ at the respective frequency bands $f_1$ and $f_2$ will be compensated for by adjusting VCC to ensure the desired output power is achieved. With the ability to control output power based on controlling VCC, the impedance of load $R_{LOAD}$ for the respective frequency bands $f_1$ and $f_2$ may vary without adversely affecting output power. Accordingly, the impedance of load $R_{LOAD}$ for antenna 26 may be as low as 3 ohms, which is much lower than the traditional 50 ohms and much closer to the output impedance of the output amplification stage 64.

The reactance of load $R_{LOAD}$ for respective frequency bands $f_1$ and $f_2$ has a significant impact on amplifier efficiency and distortion of transmitted signals in both linear and saturation modes. Typically, the lower the reactance of load $R_{LOAD}$, the greater the efficiency and the smaller the distortion. However, the presence of a small, negative reactance tends to minimize distortion due to compression when operating in a linear mode. In a saturation mode, the presence of a small, positive reactance tends to optimize efficiency. Accordingly, the optional impedance component 76 may be adjusted or switched in or out of the circuit to fine tune effective impedance of load $R_{LOAD}$ for the respective operating modes. In one embodiment, a control signal 78 from the control system 32 may be used to control the effect of the optional impedance component(s) 76 based on the mode of operation.

Figure 3:
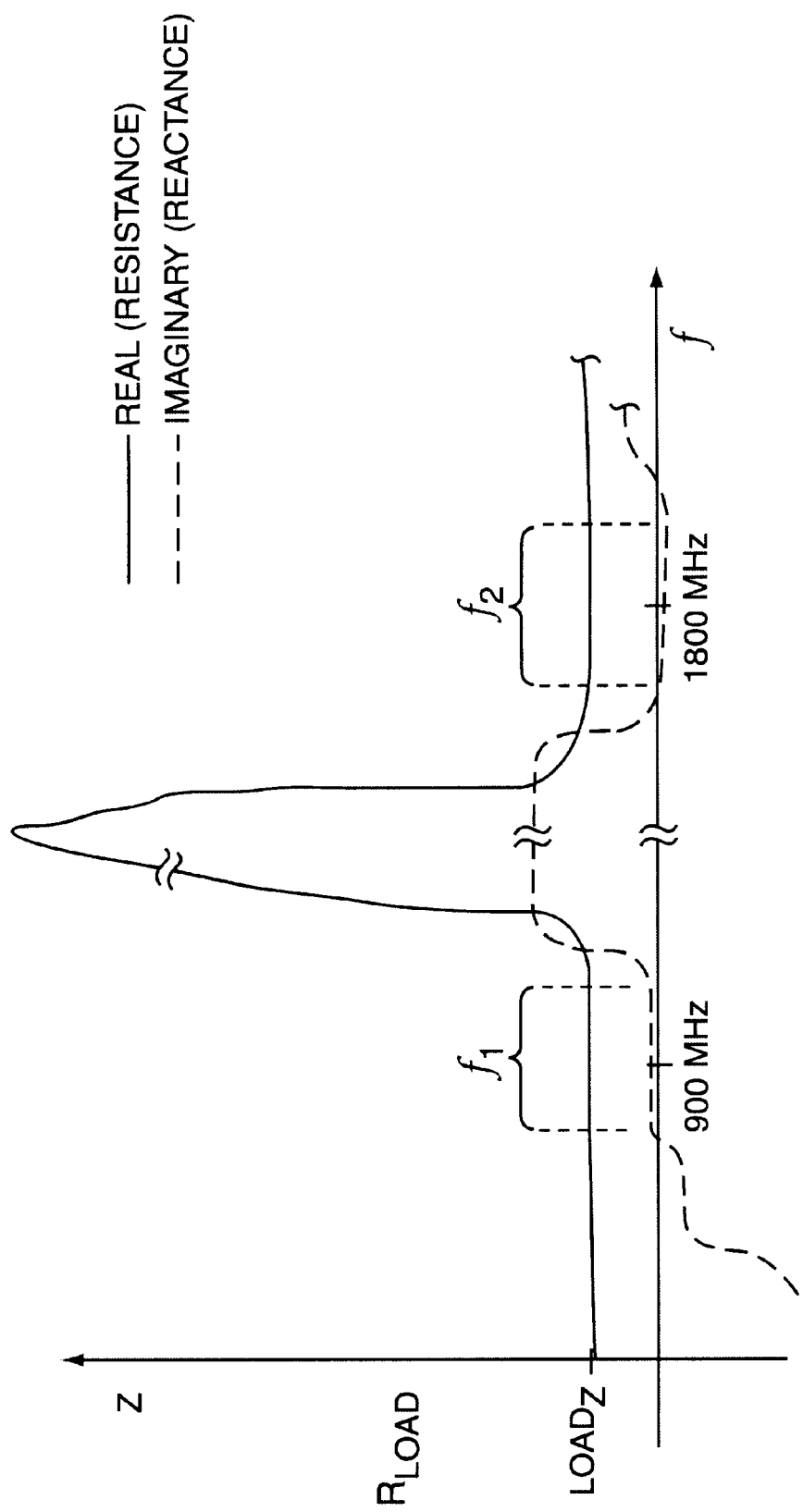
FIG. 3 is a graphical representation of an exemplary load impedance as a function of frequency for the present invention.

To further define the resistance and reactance of the impedance of load $R_{LOAD}$ for the respective operating modes, the load $R_{LOAD}$ is preferably designed to have consistent impedance characteristics at least throughout the respective frequency bands $f_1$ and $f_2$. FIG. 3 illustrates the impedance as a function of frequency for an exemplary load $R_{LOAD}$. Notably, the real component, or resistance, throughout the respective frequency bands $f_1$ and $f_2$ is relatively flat. Although the resistance $LOAD_z$ is shown substantially equal for both frequency bands $f_1$ and $f_2$, the respective resistances may vary in practice. Further, assuming that transmission in frequency band $f_1$ requires amplifier operation in a saturated mode and transmission in frequency band $f_2$ requires amplifier operation in a linear mode, the imaginary component, or reactance, of the load $R_{LOAD}$ for frequency band $f_1$ is preferably slightly positive and for frequency band $f_2$ is slightly negative.

As an example, a tri-mode mobile terminal 20 capable of operating in three distinct modes and having an antenna 26 having a load $R_{LOAD}$ of 50 ohms may having the following operational characteristics. For a 900 MHz GSM mode requiring operation at 35 dBm, VCC is approximately 18 volts for a 50 ohm load. For an 1800 MHz PCS mode requiring 33.5 dBm, VCC is dropped to 15 volts. For a linear, CDMA mode requiring operation at 29 dBm, VCC is further dropped to approximately 12 volts. Importantly, within any mode, reducing VCC can reduce output power. For linear applications, output power may be reduced by reducing VCC to maintain adjacent channel power ratios (ACPRs).

The present invention provides numerous improvements to the state-of-the-art of dual and triple mode mobile terminals. Notably, a single broadband output power amplification stage can be used for all modes, frequency bands, and powers. Within any mode or frequency band, output power may be actively controlled for optimum efficiency, minimal distortion, or a combination thereof. For example, such control may include backing off from a given output power to obtain a desired ACPR. Those skilled in the art will recognize improvements and modifications to the preferred embodiments of the present invention. All such improvements and modifications are considered within the scope of the concepts disclosed herein and the claims that follow.

What is claimed is:

1. A radio frequency communication system comprising:
    a) radiating circuitry including an antenna and having a load impedance;
    b) a wideband power amplifier output stage coupled to the radiating circuitry and adapted to amplify a radio frequency signal in each of a plurality of frequency bands corresponding to a plurality of operating modes;
    c) a variable power supply adapted to provide a selected supply voltage for supplying power to the wideband power amplifier output stage responsive to a power control signal; and
    d) a control system adapted to generate the power control signal based on a selected one of the plurality of operating modes such that the power delivered to the radiating circuitry for each of the plurality of operating modes from the wideband power amplifier output stage is determined by the selected supply voltage and the load impedance for the frequency band of the selected operating mode.

2. The radio frequency communication system of claim 1 wherein the power level within at least one of the selected operating modes is further controlled by controlling a signal level for the radio frequency signals to be amplified by the wideband power amplifier output stage.

3. The radio frequency communication system of claim 1 wherein the power level within at least one of the selected operating modes is further controlled by further controlling the selected supply voltage.

4. The radio frequency communication system of claim 1 wherein the wideband power amplifier output stage is comprised of transistors configured to operate in saturation when in one of the selected operating modes.

5. The radio frequency communication system of claim 1 wherein the wideband power amplifier output stage is comprised of transistors configured for linear operation when in one of the selected operating modes.

6. The radio frequency communication system of claim 1 wherein the wideband power amplifier output stage is comprised of transistors configured to operate in saturation when in a first of the selected operating modes and for linear operation when in a second of the selected operating modes.

7. The radio frequency communication system of claim 1 further comprising:
    a) at least one wideband intermediate amplifier stage coupled in series to the wideband power amplifier output stage; and
    b) combining circuitry for passing signals within the frequency band of the selected operating mode from modulation circuitry to the at least one wideband intermediate amplifier stage.

8. The radio frequency communication system of claim 7 wherein the modulation circuitry is adapted to modulate data for transmission using different modulation techniques for the plurality of operating modes.

9. The radio frequency communication system of claim 1 wherein the wideband power amplifier output stage comprises an array of parallel, bipolar transistors wherein the collectors are coupled together to provide an output for driving the radiating circuitry and coupled to the supply voltage via filter circuitry.

10. The radio frequency communication system of claim 9 wherein the filter circuitry is configured to block frequency components corresponding to each of the plurality of frequency bands.

11. The radio frequency communication system of claim 1 further comprising bias circuitry for providing bias to the wideband power amplifier output stage, the bias configured to optimize efficiency of the wideband power amplifier output stage at different supply voltages for each of the plurality of operating modes.

12. The radio frequency communication system of claim 1 wherein the radiating circuitry further comprises a selectable impedance component to adjust the reactance of the load impedance for at least one of the operation modes to optimize signal transmission.

13. The radio frequency communication system of claim 1 wherein the radiating circuitry is configured to provide a first impedance for the load impedance for a first frequency band and a second impedance for the load impedance for a second frequency band.

14. The radio frequency communication system of claim 13 wherein the first and second impedances are approximately the same.

15. A method comprising:
    a) amplifying a radio frequency signal in each of a plurality of frequency bands corresponding to a plurality of operating modes with a wideband power amplifier output stage;
    b) coupling the amplified radio frequency signal to radiating circuitry having a load impedance for transmission; and
    c) providing a selected supply voltage for supplying power to the wideband power amplifier output stage based on a selected one of the plurality of operating modes such that the power delivered to the radiating circuitry for each of the plurality of operating modes from the wideband power amplifier output stage is determined by the selected supply voltage and a load impedance of the radiating circuitry for the frequency band of the selected operating mode.

16. The method of claim 15 wherein a power level within at least one of the selected operating modes is further controlled by controlling a signal level for the radio frequency signals to be amplified by the wideband power amplifier output stage.

17. The method of claim 15 wherein a power level within at least one of the selected operating modes is further controlled by further controlling the selected supply voltage.

18. The method of claim 15 wherein the amplifying step further comprises operating the wideband power amplifier output stage in a saturation region when in one of the selected operating modes.

19. The method of claim 15 wherein the amplifying step further comprises operating the wideband power amplifier output stage in a linear region when in one of the selected operating modes.

20. The method of claim 15 wherein the amplifying step further comprises operating the wideband power amplifier output stage in a saturation region when in a first of the selected operating modes and in a linear region when in a second of the selected operating modes.

21. The method of claim 15 further comprising adjusting a reactance of the load impedance for at least one of the operating modes to optimize signal transmission.

22. The method of claim 15 wherein the radiating circuitry is configured to provide a first impedance for the load impedance for a first frequency band and a second impedance for the load impedance for a second frequency band.

23. The method of claim 22 wherein the first and second impedances are approximately the same.

24. A communication system comprising:
 a) a wideband power amplifier output stage for amplifying a radio frequency signal in each of a plurality of frequency bands corresponding to a plurality of operating modes;
 b) means for coupling the amplified radio frequency signal to radiating circuitry having a load impedance for transmission; and
 c) means for providing a selected supply voltage for supplying power to the wideband power amplifier output stage based on a selected one of the plurality of operating modes such that the power delivered to the radiating circuitry for each of the plurality of operating modes from the wideband power amplifier output stage is determined by the selected supply voltage and a load impedance of radiating circuitry for the frequency band of the selected operating mode.

25. The communication system of claim 24 further comprising means for controlling the power level within at least one of the selected operating modes by controlling a signal level for the radio frequency signals to be amplified by the wideband power amplifier output stage.

26. The communication system of claim 24 further comprising means for controlling the power level within at least one of the selected operating modes by controlling the selected supply voltage.

27. The communication system of claim 24 further comprising means for biasing the wideband power amplifier output stage to operate in a saturation region when in one of the selected operating modes.

28. The communication system of claim 24 further comprising means for biasing the wideband power amplifier output stage to operate in a linear region when in one of the selected operating modes.

29. The communication system of claim 24 further comprising means for biasing the wideband power amplifier output stage to operate in a saturation region when in a first of the selected operating modes and in a linear region when in a second of the selected operating modes.

30. The communication system of claim 24 further comprising means for adjusting a reactance of the load impedance for at least one of the operating modes to optimize signal transmission.

* * * * *